US009609775B2

(12) United States Patent
Sunaga et al.

(10) Patent No.: US 9,609,775 B2
(45) Date of Patent: Mar. 28, 2017

(54) SEMICONDUCTOR MODULE

(71) Applicant: NSK Ltd., Shinagawa-ku, Tokyo (JP)

(72) Inventors: Takashi Sunaga, Tokyo (JP); Noboru Kaneko, Tokyo (JP); Osamu Miyoshi, Tokyo (JP)

(73) Assignee: NSK Ltd., Tokyo (JP)

( * ) Notice: Subject to any disclaimer, the term of this patent is extended or adjusted under 35 U.S.C. 154(b) by 41 days.

(21) Appl. No.: 14/435,682

(22) PCT Filed: Oct. 25, 2013

(86) PCT No.: PCT/JP2013/006341
§ 371 (c)(1),
(2) Date: Apr. 14, 2015

(87) PCT Pub. No.: WO2014/068936
PCT Pub. Date: May 8, 2014

(65) Prior Publication Data
US 2015/0342074 A1    Nov. 26, 2015

(30) Foreign Application Priority Data

Nov. 5, 2012  (JP) ................................. 2012-243685
Jul. 11, 2013  (JP) ................................. 2013-145651

(51) Int. Cl.
H05K 7/00        (2006.01)
H05K 7/02        (2006.01)
(Continued)

(52) U.S. Cl.
CPC ........... H05K 7/02 (2013.01); H01L 23/3735 (2013.01); H01L 23/49811 (2013.01);
(Continued)

(58) Field of Classification Search
USPC ................ 361/807, 809, 810, 803, 728–730; 257/666, 776, 778, E21.51, E23.006,
(Continued)

(56) References Cited

U.S. PATENT DOCUMENTS 4,788,626 A * 11/1988 Neidig .................... H01L 23/10
174/538
7,755,185 B2 * 7/2010 Bayerer ................ H01L 23/373
257/714
(Continued)

FOREIGN PATENT DOCUMENTS

EP    1 703 554 A2    9/2006
JP    2000-124398 A    4/2000
(Continued)

OTHER PUBLICATIONS

International Search Report (PCT/ISA/210) dated Dec. 24, 2013, with English translation (Three (3) pages).
(Continued)

Primary Examiner — Hung S Bui
(74) Attorney, Agent, or Firm — Crowell & Moring LLP

(57) ABSTRACT

To provide a semiconductor module capable of shortening of the manufacturing tact time, reducing the manufacturing costs, and improving assembly. A semiconductor module (30) includes substrate (31) made of metal, an insulating layer (32) formed on the substrate (31), a plurality of wiring patterns (33a to 33d) formed on the insulating layer (32), a bare-chip transistor (35) mounted on a wiring pattern (33a) via a solder (34a); and a metal plate connector (36a, 36b) jointing an electrode (S, G) of the bare-chip transistor (35) and a wiring pattern (33b, 33c) via a solder (34b, 34c). The metal plate connector (36a, 36b) has a bridge shape, and has a flat surface and a center of gravity at a middle portion of the component.

6 Claims, 7 Drawing Sheets

(51) Int. Cl.
*H01L 25/07* (2006.01)
*H01L 25/18* (2006.01)
*H01L 23/373* (2006.01)
*H01L 23/498* (2006.01)
*H01L 23/00* (2006.01)
*H01L 23/14* (2006.01)

(52) U.S. Cl.
CPC .............. *H01L 24/35* (2013.01); *H01L 24/37* (2013.01); *H01L 24/41* (2013.01); *H01L 24/83* (2013.01); *H01L 24/84* (2013.01); *H01L 24/92* (2013.01); *H01L 25/07* (2013.01); *H01L 25/072* (2013.01); *H01L 25/18* (2013.01); H01L 23/142 (2013.01); H01L 24/29 (2013.01); H01L 24/32 (2013.01); H01L 24/33 (2013.01); H01L 24/40 (2013.01); H01L 24/73 (2013.01); H01L 2224/291 (2013.01); H01L 2224/293 (2013.01); H01L 2224/29294 (2013.01); H01L 2224/32227 (2013.01); H01L 2224/32238 (2013.01); H01L 2224/32245 (2013.01); H01L 2224/33181 (2013.01); H01L 2224/352 (2013.01); H01L 2224/35847 (2013.01); H01L 2224/3701 (2013.01); H01L 2224/37013 (2013.01); H01L 2224/37124 (2013.01); H01L 2224/37139 (2013.01); H01L 2224/37144 (2013.01); H01L 2224/37147 (2013.01); H01L 2224/40095 (2013.01); H01L 2224/40227 (2013.01); H01L 2224/40475 (2013.01); H01L 2224/40499 (2013.01); H01L 2224/4103 (2013.01); H01L 2224/4112 (2013.01); H01L 2224/48 (2013.01); H01L 2224/73263 (2013.01); H01L 2224/77272 (2013.01); H01L 2224/8321 (2013.01); H01L 2224/83191 (2013.01); H01L 2224/83192 (2013.01); H01L 2224/83424 (2013.01); H01L 2224/83447 (2013.01); H01L 2224/83815 (2013.01); H01L 2224/84424 (2013.01); H01L 2224/84447 (2013.01); H01L 2224/84815 (2013.01); H01L 2224/85 (2013.01); H01L 2224/9221 (2013.01); H01L 2924/014 (2013.01); H01L 2924/1305 (2013.01); H01L 2924/1306 (2013.01); H01L 2924/13055 (2013.01); H01L 2924/19105 (2013.01); H01L 2924/3011 (2013.01); H01L 2924/351 (2013.01)

(58) Field of Classification Search
USPC .................................................. 257/E23.162
See application file for complete search history.

(56) References Cited

U.S. PATENT DOCUMENTS

| | | | | |
|---|---|---|---|---|
| 8,164,176 | B2* | 4/2012 | Siepe | H01L 23/3735 257/700 |
| 9,076,782 | B2* | 7/2015 | Soyano | H01L 23/3735 |
| 2004/0217488 | A1* | 11/2004 | Luechinger | H01L 23/4952 257/784 |
| 2007/0069344 | A1 | 3/2007 | Yamashita et al. | |
| 2010/0089607 | A1 | 4/2010 | Nakamura et al. | |
| 2012/0068357 | A1 | 3/2012 | Saito et al. | |

FOREIGN PATENT DOCUMENTS

| | | |
|---|---|---|
| JP | 2004-335725 A | 11/2004 |
| JP | 2007-95984 A | 4/2007 |
| JP | 2008-294390 A | 12/2008 |
| JP | 2009-259981 A | 11/2009 |
| JP | 2012-69640 A | 4/2012 |
| JP | 2012-212712 A | 11/2012 |

OTHER PUBLICATIONS

Japanese language Written Opinion (PCT/ISA/237) dated Dec. 24, 2013 (Three (3) pages).
Japanese Office Action dated Oct. 21, 2014, with partial English translation (Five (5) pages).
Chinese Office Action issued in counterpart Chinese Application No. 201380003694.8 dated Jan. 28, 2016, English translation only (four (4) pages).
International Preliminary Report on Patentability (PCT/IB/338 & PCT/IB/373) dated May 14, 2015, including English translation of Document C2 (Japanese-language Written Opinion (PCT/ISA/237)) previously filed on Apr. 14, 2015 (Five (5) pages.
Extended European Search Report issued in counterpart European Application No. 13 851 225.6 dated Jul. 28, 2016, (seven (7) pages).

* cited by examiner

REFLOW

SEMICONDUCTOR MODULE

TECHNICAL FIELD

The present invention relates to a semiconductor module such as a power module incorporated into an automotive electrical equipment.

BACKGROUND ART

In recent years, electronic devices have been introduced for controlling various electrical equipment in a vehicle such as an automobile. In an electric power steering apparatus as an example of an electrical equipment into which an electronic device is incorporated, there is provided a motor drive unit in an enclosure accommodating an electric motor for steering an automobile and the electronic device is mounted on the motor drive unit. The electronic device is incorporated as a power module into the motor drive unit.

The power module is constituted as a so-called semiconductor module on which a power element such as a field effect transistor (FET) or an insulated gate bipolar transistor (IGBT) suitable for controlling an electrical equipment driven with a relatively large current, such as an electric power steering apparatus. Such a type of power module is also called "in-vehicle module", because it is mounted on a vehicle.

In the related art, there is, for example, a technique described in PTL 1 as this type of semiconductor module. In this technique, wires are used for electrical interconnections that joint wiring patterns and bare-chip transistors on a metal substrate.

Additionally, for example, as in a technique described in PTL 2, lead components are used for electrical connection of semiconductor elements mounted on a metal substrate to perform solder mounting. Here, the semiconductor elements and the substrate having different heights respectively, are jointed by inclining the lead components.

Moreover, for example, as in a technique described in PTL 3, in order to reduce the stress in a connector wiring, a rising bending portion may be provided, or a fuse shape (a wavy shape) may be provided in the middle of the wiring.

CITATION LIST

Patent Literatures

PTL 1: JP 2004-335725 A
PTL 2: JP 2007-95984 A
PTL 3: JP 2000-124398 A

SUMMARY OF INVENTION

Technical Problem

However, in the technique described in the above PTL 1, the electrical interconnections using wires are adopted. Therefore, it is necessary to mount the electrical interconnections by a wire bonding apparatus. That is, it is necessary to perform wire bonding in a manufacturing process different from solder mounting for other electronic components, and manufacturing tact time is increased. Additionally, a dedicated facility for wire bonding is necessary, thus, the manufacturing costs are increased.

Additionally, in the technique described in the above PTL 2, a lead component inclines from a semiconductor element side toward a substrate side. Therefore, a position of the lead component to be suctioned and held during assembly (during arrangement of the lead component) is one of a flat portion formed at end portions of the lead component. Therefore, the weight balance during suction of components is poor, and there is a concern about positional deviation during arrangement of the components.

Moreover, in the technique described in the above PTL 3, the fuse shape is provided in the middle of the wiring. Therefore, a position of the component can be suctioned during assembly is a flat surface formed at the end portion. Accordingly, the weight balance during suction holding of the component is also poor in this case, and there is a concern of positional deviation during arrangement of the components.

Thus, an object of the invention is to provide a semiconductor module capable of shortening the manufacturing tact time, reducing the manufacturing costs, and improving assembility.

Solution to Problem

In order to solve the above problems, one aspect of the semiconductor module of the invention is as follows. That is, according to one aspect of the semiconductor module of the invention, there is provided a semiconductor module including a substrate made of metal; an insulating layer formed on the substrate; a plurality of wiring patterns formed on the insulating layer; a bare-chip transistor mounted on one wiring pattern out of the plurality of wiring patterns via a solder; and a metal plate connector formed of a metal plate, the metal plate connector jointing an electrode formed on a top surface of the bare-chip transistor and another wiring pattern out of the plurality of wiring patterns via a solder. The metal plate connector has a shape including a horizontal flat plate portion; a first leg being bent so as to fall down from one end of the flat plate portion in a width direction of the flat plate portion and jointed on the electrode; and a second leg being bent so as to fall down from the other end of the flat plate portion in the width direction and jointed on the another wiring pattern. The metal plate connector is made of any one material out of copper (Cu), silver (Ag), gold (Au), a copper alloy, and an aluminum alloy conductor so as to have elasticity at least in a horizontal direction.

That is, the metal plate connector has a shape capable of elastically absorbing relative displacement of the jointing portion of the metal plate connector at least in one direction, the relative displacement occurring during heating or during cooling due to differences between the thermal expansion coefficient and the thermal contraction coefficient of the metal plate connector and those of the substrate or the insulating layer. In addition, the metal plate connector has a flat surface between the first leg and the second leg, the flat surface being able to be suctioned and held for holding the metal plate connector in assembling.

In this way, since the metal plate connector formed of the metal plate is used as a jointing member between the electrode of the bare-chip transistor and the wiring pattern on the substrate, the jointing among them can be performed by solder mounting. That is, the jointing between the electrode of the bare-chip transistor and the wiring pattern on the substrate, and the solder mounting operation for mounting the bare-chip transistor and other substrate-mounted components on the wiring pattern on the substrate can be simultaneously performed in the same facility and in the same process. Therefore, the manufacturing tact time of the semiconductor module can be shortened, a dedicated facility for wire bonding becomes unnecessary, and the manufacturing costs of the semiconductor module can be reduced.

Moreover, since the metal plate connector has a bridge shape, elastic absorption of the relative position displacement between the legs become more preferable even if the legs are jointed to the wiring patterns by solders. That is, a stress, which is applied to the jointing portion due to the thermal contraction and the thermal expansion of the substrate and the metal plate connector caused by heating during a reflow process included in the solder mounting operation and the operation heat of the semiconductor module, can be more preferably reduced, and the reliability of the jointing portion can be secured. Additionally, the metal plate connector has the bridge shape of which the first leg and the second leg are connected by the flat plate portion, the center-of-gravity position of the metal plate connector can be located at a portion of the flat surface of the flat plate portion. Therefore, it is easy to suction and hold the portion including the center-of-gravity position of the metal plate connector during suction of components in assembling. By suctioning and holding the portion including the center-of-gravity position of the metal plate connector, the stability of suction and holding is improved. Therefore, the stability during so-called transfer can be improved, and the accuracy of components arrangement positions can be secured.

Additionally, in the above semiconductor module, an end of the first leg may be connected to the one end of the flat plate portion in the width direction via a first bent portion, and a joint surface jointed via the solder on the electrode may be connected to another end of the first leg via a second bent portion so as to protrude outward in the width direction of the flat plate portion, and an end of the second leg may be connected to the other end of the flat plate portion in the width direction via a third bent portion, and a joint surface jointed via the solder on the another wiring pattern may be connected to another end of the second leg via a fourth bent portion so as to protrude outward in the width direction of the flat plate portion.

In this way, by forming the four bent portions, the flat plate portion of the metal plate connector can be a top surface spaced from the substrate, and the top surface can have appropriately a flat surface. Additionally, the metal plate connector has a substantially hat-shaped cross-section that also has a bridge shape, and thus the metal plate connector becomes more suitable for manufacture using press molding. That is, spring back in press working can be suppressed, and components precision can be improved.

Moreover, in the above semiconductor module, each of angles of the first bent portion, the second bent portion, the third bent portion, and the fourth bent portion is an obtuse angle.

In this way, since the angles of the four bent portions are obtuse angles, mold releasability during press molding can be improved, which contributes to reduction of the manufacturing costs.

Advantageous Effects of Invention

In the semiconductor module of the invention, since the metal plate connector formed of the metal plate is used as a jointing member between the electrode of the bare-chip transistor and the wiring pattern on the substrate, the jointing among them can be performed by solder mounting. That is, the jointing between the electrode of the bare-chip transistor and the wiring pattern on the substrate, and the solder mounting operation for mounting the bare-chip transistor and other substrate-mounted components on the wiring pattern on the substrate can be simultaneously performed in the same facility and in the same process. Therefore, the manufacturing tact time of the semiconductor module can be shortened, a dedicated facility for wire bonding becomes unnecessary, and the manufacturing costs of the semiconductor module can be reduced.

Additionally, since the metal plate connector has a bridge shape, displacement in vertical and horizontal directions can be absorbed. Therefore, a stress, which is applied to the jointing portion due to the thermal contraction and the thermal expansion of the substrate and the metal plate connector caused by heating during a reflow process included in the solder mounting operation and the operation heat of the semiconductor module, can be reduced, and the reliability of the jointing portion can be secured. Moreover, since the center of gravity can be located on the flat surface of the metal plate connector, components can be suctioned and held in a well-balanced manner by suctioning the center-of-gravity position of the metal plate connector during suction of the components in assembling. Accordingly, the stability during transfer can be improved, and assembling arrangement position accuracy can be improved.

DESCRIPTION OF EMBODIMENTS

Hereinafter, embodiments of the present invention will be described with reference to the accompanying drawings.

Figure 1:
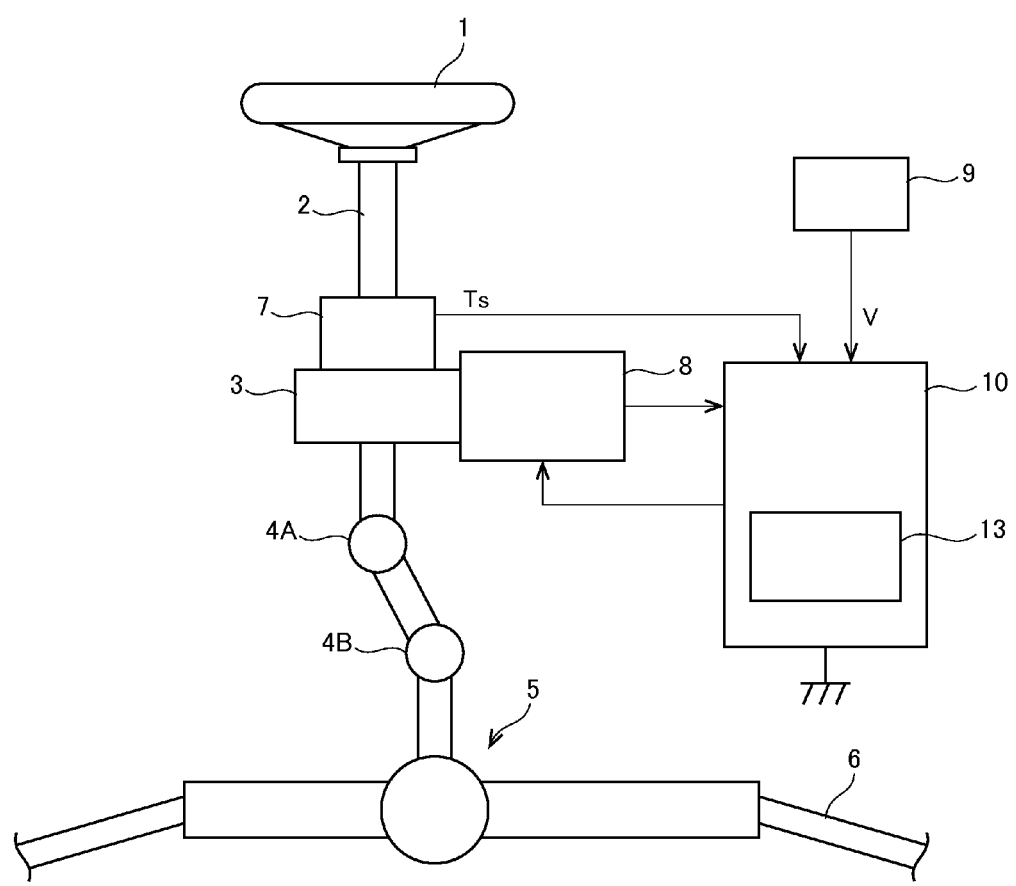
FIG. 1 is a view illustrating the basic structure of an electric power steering apparatus employing a semiconductor module of the invention.

FIG. 1 is a view illustrating the basic structure of an electric power steering apparatus employing a semiconductor module of the invention.

In the electric power steering apparatus illustrated in FIG. 1, a column shaft 2 of a steering wheel 1 is coupler with tie rods 6 of steered wheels via a reduction gear 3, universal joints 4A and 4B, and a rack and pinion mechanism 5. The column shaft 2 is provided with a torque sensor 7 for detecting the steering torque of the steering wheel 1, and an electric motor 8 for assisting the steering effort of the steering wheel 1 is connected to the column shaft 2 via the reduction gear 3. A controller 10 that controls the electric power steering apparatus is supplied with electric power from a battery, not illustrated, and receives an ignition key signal IGN (see FIG. 2) via an ignition key, not illustrated. The controller 10 calculates a steering assist command value as an assist (steering assist) command on the basis of a steering torque Ts detected by the torque sensor 7 and a vehicle velocity V detected by a vehicle velocity sensor 9, and controls a current supplied to the electric motor 8 on the basis of the calculated steering assist command value.

Figure 2:
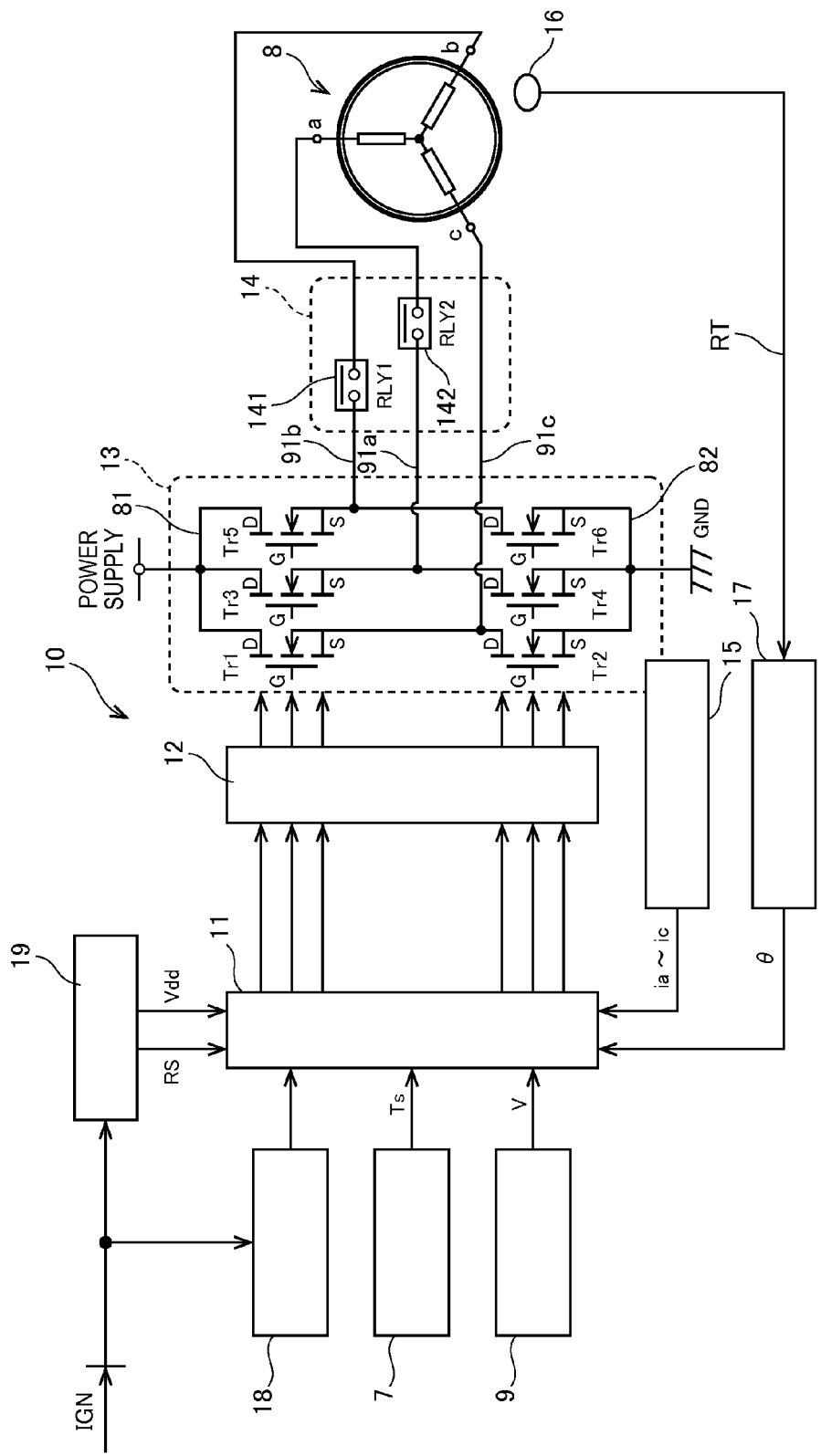
FIG. 2 is a block diagram illustrating a control system of a controller.

The controller 10 is mainly constituted of a micro computer, and the mechanism and configuration of the controlling apparatus thereof are illustrated in FIG. 2.

The steering torque Ts detected by the torque sensor 7 and the vehicle velocity V detected by the vehicle velocity sensor 9 are received by a control calculating device 11 as a control calculating unit, and a current command value calculated by the control calculating device 11 is received by a gate drive circuit 12. A gate drive signal formed by the gate drive circuit 12 based on the current command value and the like is received by a motor drive unit 13 including a bridge configuration of FETs. The motor drive unit 13 drives the electric motor 8 constituted of a three-phase brushless motor via a breaker device 14 for emergency stop. Each of phase currents of the three-phase brushless motor is detected by a current detecting circuit 15. The detected three-phase motor currents is to is are received by the control calculating device 11 as feedback currents. In addition, the three-phase brushless motor is equipped with a rotation sensor 16 such as a Hall sensor. A rotation signal RT from the rotation sensor 16 is received by a rotor position detecting circuit 17 and the detected rotation position θ is received by the control calculating device 11.

Additionally, the ignition signal IGN from the ignition key is received by an ignition voltage monitoring unit 18 and a power supply circuit unit 19. Source voltage Vdd from the power supply circuit unit 19 is received by the control calculating device 11 and a reset signal RS for stopping the apparatus is received by the control calculating device 11. The breaker device 14 is constituted of relay contacts 141 and 142 for breaking two phases.

Additionally, the circuit configuration of the motor drive unit 13 will be described below. A serial connection of FETs Tr1 and Tr2, a serial connection of FETs Tr3 and Tr4, and a serial connection of FETs Tr5 and Tr6 are connected to a power supply line 81. The FETs Tr1, Tr3, and Tr5 are connected in parallel to the power supply line 81, and the FETs Tr2, Tr4, and Tr6 are connected in parallel to a ground line 82. Such a configuration constitutes an inverter. In such a configuration, in the FETs Tr1 and Tr2, the source electrode S of the FET Tr1 and the drain electrode D of the FET Tr2 are connected in series to constitute a c-phase arm of the three-phase motor, and a current is output at a c-phase output line 91c. In the FETs Tr3 and Tr4, the source electrode S of the FET Tr3 and the drain electrode D of the FET Tr4 are connected in series to constitute an a-phase arm of the three-phase motor, and a current is output at an a-phase output line 91a. In the FETs Tr5 and Tr6, the source electrode S of the FET Tr5 and the drain electrode D of the FET Tr6 are connected in series to constitute a b-phase arm of the three-phase motor and a current is output at a b-phase output line 91b.

Figure 3:
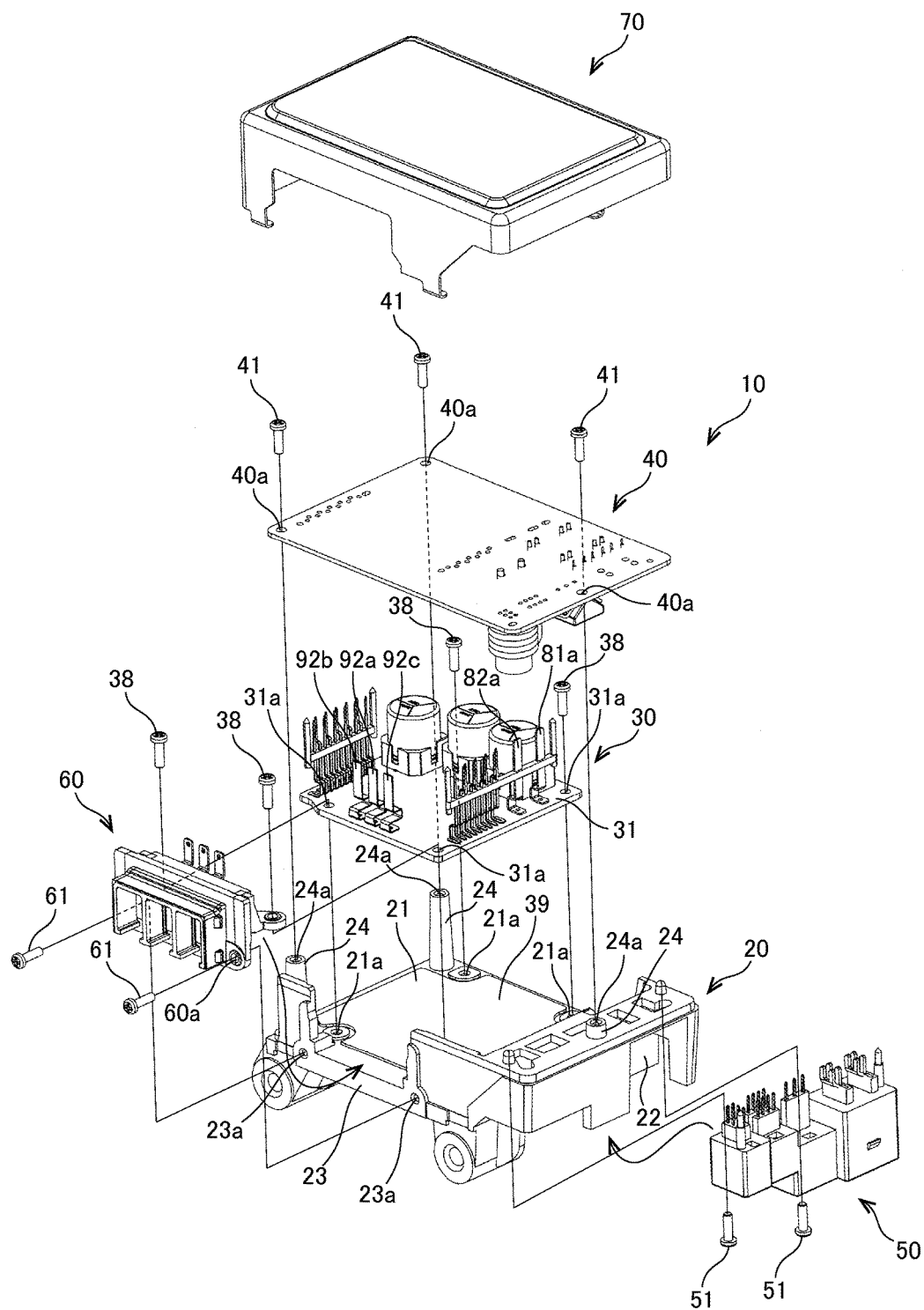
FIG. 3 is an exploded perspective view of a controller including the semiconductor module.

FIG. 3 is an exploded perspective view of the controller 10 including the semiconductor module of the electric power steering apparatus illustrated in FIG. 1. The controller 10 includes a case 20, a semiconductor module 30 as a power module including the motor drive unit 13, a heat-dissipating sheet 39, a control circuit board 40 including the control calculating device 11 and the gate drive circuit 12, a power/signal connector 50, a three-phase output connector 60, and a cover 70.

Here, the case 20 is formed to have a substantially rectangular shape and includes a tabular semiconductor module placement section 21 on which the semiconductor module 30 is placed, a power/signal connector mounting section 22 arranged at an end part in a length direction of the semiconductor module placement section 21 so as to mount the power/signal connector 50 thereon, and a three-phase output connector mounting section 23 arranged at an end in a width direction of the semiconductor module placement section 21 so as to mount the three-phase output connector 60 thereon.

Additionally, plural screw holes 21a into which attachment screws 38 for attaching the semiconductor module 30 are screwed are formed on the semiconductor module placement section 21. The semiconductor module placement section 21 and the power/signal connector mounting section 22 are provided plural attachment posts 24 vertically standing for attaching the control circuit board 40. Screw holes 24a into which attachment screws 41 for attaching the control circuit board 40 are screwed are formed on the attachment posts 24, respectively. Furthermore, plural screw holes 23a into which attachment screws 61 for attaching the three-phase output connector 60 are screwed are formed on the three-phase output connector mounting section 23.

Figure 4:
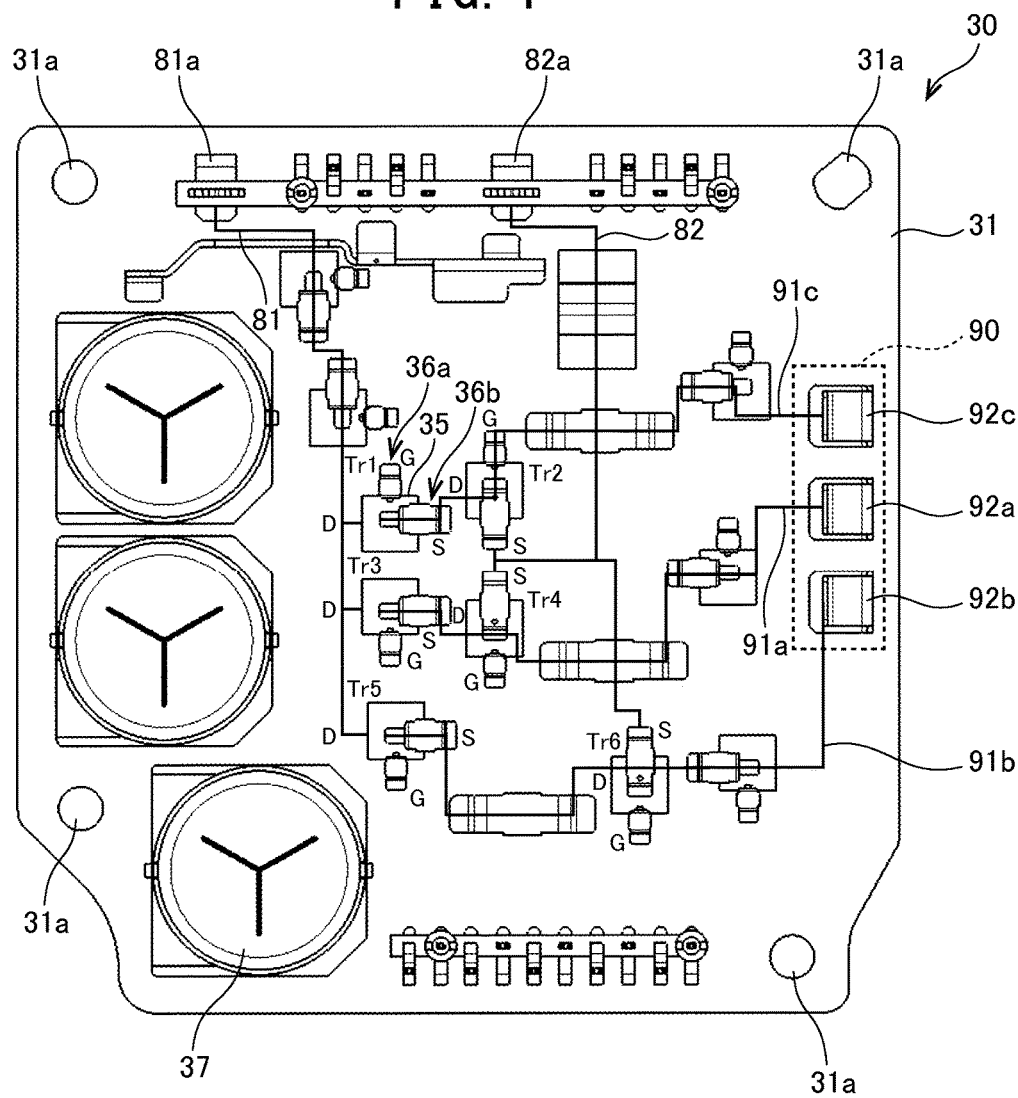
FIG. 4 is a plan view of the semiconductor module.

In addition, the semiconductor module 30 has the circuit configuration of the motor drive unit 13 described above. As illustrated in FIG. 4, the six FETs Tr1 to Tr6, a positive electrode terminal 81a connected to the power supply line 81, and a negative electrode terminal 82a connected to the ground line 82 are mounted on a substrate 31. A three-phase output portion 90 including an a-phase output terminal 92a connected to the a-phase output line 91a, a b-phase output terminal 92b connected to the b-phase output line 91b, and a c-phase output terminal 92c connected to the c-phase output line 91c are mounted on the substrate 31. Other substrate-mounted components 37 including a capacitor are mounted on the substrate 31. Furthermore, plural through-holes 31a into which attachment screws 38 for attaching the semiconductor module 30 are inserted are formed on the substrate 31 of the semiconductor module 30.

Figure 5:
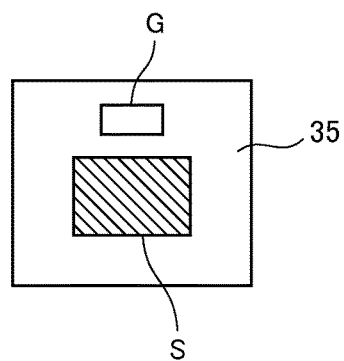
FIG. 5 is an outline plan view of a bare-chip FET.

Here, the mounting of the six FTTs Tr1 to Tr6 on the substrate 31 in the semiconductor module 30 will be described below. Each of the FETs Tr1 to Tr6 is constituted of a bare-chip FET (bare-chip transistor) 35 and includes a source electrode S and a gate electrode G on the bare-chip FET 35 as illustrated in FIG. 5, and includes a drain electrode, not illustrated, on the lower surface of the bare-chip FET 35.

Figure 6:
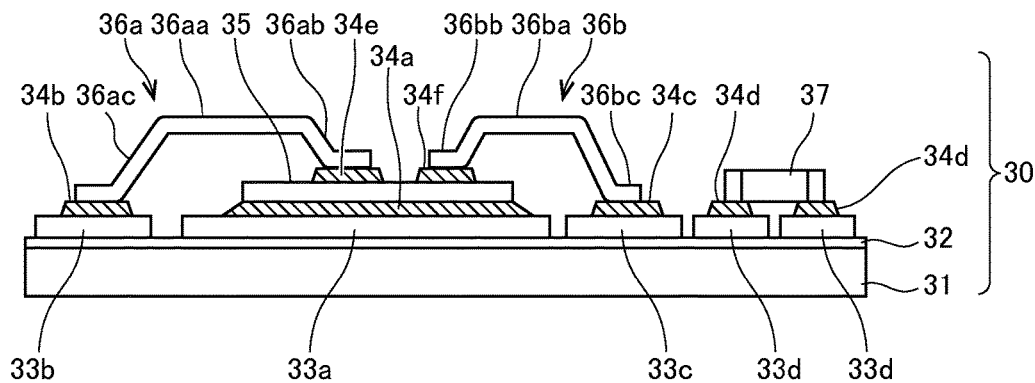
FIG. 6 is a schematic view for describing the joint state between electrodes of the bare-chip FET and wiring patterns on a substrate.

The semiconductor module 30, as illustrated in FIG. 6, includes the metallic substrate 31, and an insulating layer 32 is formed on the substrate 31. The substrate 31 is made of metal, such as aluminum. Additionally, plural wiring patterns 33a to 33d are formed on the insulating layer 32. The respective wiring patterns 33a to 33d are constituted by metal, such as copper and aluminum or the like, or an alloy including this metal.

Then, the bare-chip FET 35 constituting each of the FETs Tr1 to Tr6 is mounted via solder 34a on one wiring pattern 33a among the plurality of wiring patterns 33a to 33d. The drain electrode formed on the lower surface of the bare-chip FET 35 is jointed to the wiring pattern 33a via the solder 34a. Then, the top of the source electrode S of the bare-chip FET 35 and the top of another wiring pattern 33b among the plurality of wiring patterns 33a to 33d are jointed together via solder 34e and 34b, respectively, by a source-electrode metal plate connector 36a. The source-electrode metal plate connector 36a is formed by punching and bending a metal plate, and includes a horizontal flat plate portion 36aa, a connecting portion 36ab that is bent and extends so as to fall down from one end of the flat plate portion 36aa in the width direction of the flat plate portion 36aa and is jointed to the source electrode S of the bare-chip FET 35 via the solder 34e, and a connecting portion 36ac that is bent and extends so as to fall down from the other end of the flat plate portion 36aa in the width direction and is jointed to the wiring pattern 33b via the solder 34b.

Additionally, the top of still another wiring pattern 33c among the plural wiring patterns 33a to 33d and the top of the gate electrode G of the bare-chip FET 35 are jointed together via solder 34f and 34c, respectively, by a gate-electrode metal plate connector 36b. The gate-electrode metal plate connector 36b is formed by punching and bending a metal plate, and includes a horizontal flat plate portion 36ba, a connecting portion 36bb that is bent and extends so as to fall down from one end of the flat plate portion 36ba in the width direction of the flat plate portion 36ba and is jointed to the gate electrode G of the bare-chip FET 35 via the solder 34f, and a connecting portion 36bc that is bent and extends so as to fall down from the other end of the flat plate portion 36ba in the width direction and is jointed to the wiring pattern 33c via the solder 34c.

Additionally, the other substrate-mounted component 37, such as a capacitor, is mounted via solder 34d on a yet still another wiring pattern 33d among the plural wiring patterns 33a to 33d formed on the insulating layer 32.

Next, the shape of the source-electrode metal plate connector 36a will be described.

Figure 7:
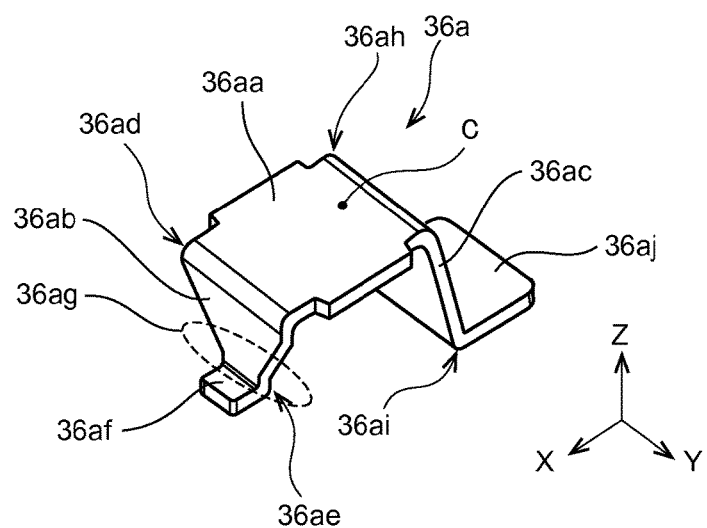
FIG. 7 is a perspective view illustrating the shape of a metal plate connector.

As illustrated in a perspective view in FIG. 7, the source-electrode metal plate connector 36a has a bridge shape including the flat plate portion 36aa, the connecting portion 36ab (a first leg), and the connecting portion 36ac (a second leg). More specifically, in the source-electrode metal plate connector 36a, one end of the connecting portion 36ab is connected to one end portion of the flat plate portion 36aa in a right-and-left direction (an X-axis direction of FIG. 7) via a first bent portion 36ad, and an outward joint surface 36af is formed via a second bent portion 36ae at the other end of the connecting portion 36ab. A lower surface of the joint surface 36af is jointed to the source electrode S of the bare-chip FET 35 via the solder 34e.

Additionally, the connecting portion 36ab has a narrow portion 36ag in the vicinity of the joint surface 36af. The narrow portion 36ag has a tapered shape that becomes narrow from the first bent portion 36ad toward the second bent portion 36ae.

One end of the connecting portion 36ac is connected to the other end portion of the flat plate portion 36aa in its right-and-left direction via a third bent portion 36ah, and an outward joint surface 36af is formed via a fourth bent portion 36ai at the other end of the connecting portion 36ac. A lower surface of the joint surface 36aj is jointed to the wiring pattern 33b via the solder 34b.

Figure 8A:
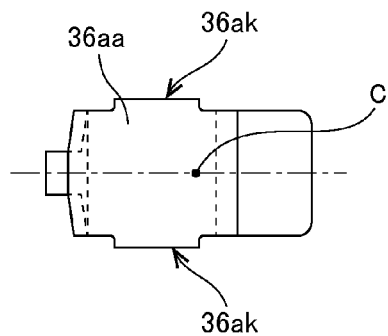
FIG. 8A is a plan view illustrating the shape of the metal plate connector.
Figure 8B:
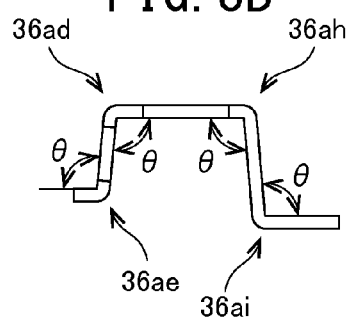
FIG. 8B is a front view illustrating the shape of the metal plate connector.

FIGS. 8A and 8B are views illustrating the shape of the source-electrode metal plate connector 36a. FIG. 8A is a plan view, and FIG. 8B is a front view.

As illustrated in FIG. 8A, in the source-electrode metal plate connector 36a, cut portions 36ak formed by a progressive press in press molding are provided at both ends of the flat plate portion 36aa in the front-and-rear direction of the flat plate portion 36aa (up-and-down direction of FIG. 8B). The cut portions 36ak formed by the progressive press have a shape protruding outward in the front-and-rear direction of the flat plate portion 36aa. Additionally, as illustrated in FIG. 8B, the source-electrode metal plate connector 36a includes four bent portions (36ad, 36ae, 36ah, 36ai), and has a substantially hat-shaped cross-section that also has a bridge shape. Here, it is assumed that the angle θ of each bent portion has an obtuse angle (for example, 95 degrees).

Figure 9A:
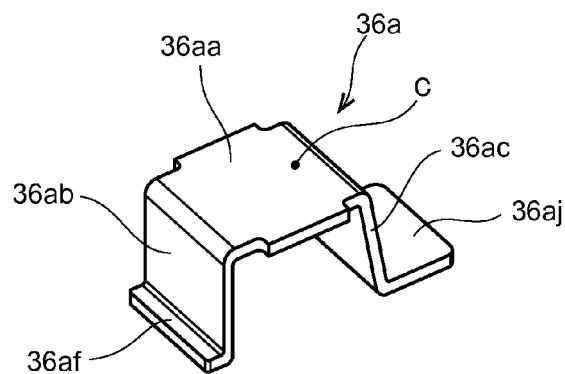
FIGS. 9A and 9B are perspective views illustrating another example of the shape of the metal plate connector.

In addition, the source-electrode metal plate connector 36a may have any shape as long as having the bridge shape capable of jointing the source electrode S and the wiring pattern 33b. For example, as illustrated in FIG. 9A, the source-electrode metal plate connector 36a may have a shape in which no narrow portion 36ag is provided. However, since reflow bonding, to be described below, is performed during solder jointing, and the temperature becomes high due to heat generation when the semiconductor module 30 operates, it is preferable to have a shape capable of reducing thermal stress. This is also the same in the gate-electrode metal plate connector 36b.

Additionally, in FIG. 7, FIGS. 8A and 8B, and FIG. 9A, design items of the flat plate portion 36aa of the source-electrode metal plate connector 36a and the flat plate portion 36ba of the gate-electrode metal plate connector 36b are determined in advance such that the center of gravity (C) is located on a plane (flat surface) of the flat plate portions, and the source-electrode metal plate connector 36a and the gate-electrode metal plate connector 36b are suctioned at the center of gravity in the suction chucking. Thus, stability during transfer is secured. As for the suction range at the center-of-gravity position in the flat plate portions 36aa, 36ba of the metal connectors 36a, 36b, an area of about 2 mm$^2$ is preferable, and an area of about 2 mm$^2$ to 5 mm$^2$ is more preferable.

Figure 9B:
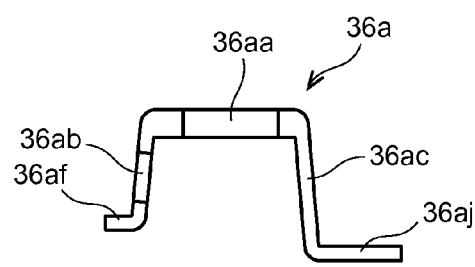

In order to locate the center of gravity (C) on the plane (flat surface) of the flat plate portion 36aa of the source-electrode metal plate connector 36a and the flat plate portion 36ba of the gate-electrode metal plate connector 36b, for example, as illustrated in FIG. 9B, the thickness of the flat plate portion 36aa (flat plate portion 36ba) is preferably larger than the thickness of the other portions of the source-electrode metal plate connector 36a (the gate-electrode metal plate connector 36b), that is, the connecting portion 36ab (the connecting portion 36bb), the connecting portion 36ac (the connecting portion 36bc), the joint surface 36af, and the joint surface 36aj. Although the size of the thickness of the flat plate portion 36aa (the flat plate portion 36ba) is not particularly limited, for example, the thickness may be 3 times greater than the thickness of the other portions of the source-electrode metal plate connector 36a (the gate-electrode metal plate connector 36b), that is, the connecting portion 36ab (the connecting portion 36bb), the connecting portion 36ac (the connecting portion 36bc), the joint surface 36af, and the joint surface 36aj.

The semiconductor module 30 configured in this way, as illustrated in FIG. 3, is attached on the semiconductor module placement section 21 of the case 20 by the plural attachment screws 38. Plural through-holes 31a through which the attachment screws 38 are inserted are formed on the substrate 31 of the semiconductor module 30.

In addition, when the semiconductor module 30 is attached on the semiconductor module placement section 21, the heat-dissipating sheet 39 is attached on the semiconductor module placement section 21, and the semiconductor module 30 is attached on the heat-dissipating sheet 39. The heat-dissipating sheet 39 allows the heat generated in the semiconductor module 30 to be dissipated to the case 20 via the heat-dissipating sheet 39.

Additionally, a control circuit including the control calculating device 11 and the gate drive circuit 12 is constructed by mounting plural electronic components on the control circuit board 40. After the semiconductor module 30 is attached onto the semiconductor module placement section 21, the control circuit board 40 is attached onto the plural attachment posts 24 vertically standing on the semiconductor module placement section 21 and the power/signal connector mounting section 22 with the plural attachment screws 41 from the upper side of the semiconductor module 30. Plural through-holes 40a into which the attachment screws 41 are inserted are formed in the control circuit board 40.

Additionally, the power/signal connector 50 is used to supply DC power from a battery (not illustrated) to the semiconductor module 30 and to receive various signals including signals from the torque sensor 12 and the vehicle velocity sensor 9 by the control circuit board 40. The power/signal connector 50 is attached onto the power/signal connector mounting section 22 arranged on the semiconductor module placement section 21 with plural attachment screws 51.

The three-phase output connector 60 is used to output currents from the a-phase output terminal 92a, the b-phase output terminal 92b, and the c-phase output terminal 92c. The three-phase output connector 60 is attached onto the three-phase output connector mounting section 23 arranged at an end of the semiconductor module placement section 21 in the width direction with plural attachment screws 61. Plural through-holes 60a into which the attachment screws 61 are inserted are formed in the three-phase output connector 60.

Furthermore, the cover 70 is attached onto the case 20 to which the semiconductor module 30, the control circuit board 40, the power/signal connector 50, and the three-phase output connector 60 are attached so as to cover the control circuit board 40 from the above of the control circuit board 40.

Next, a method for manufacturing the semiconductor module 30 will be described with reference to FIGS. 10A to 10E.

Figure 10A:
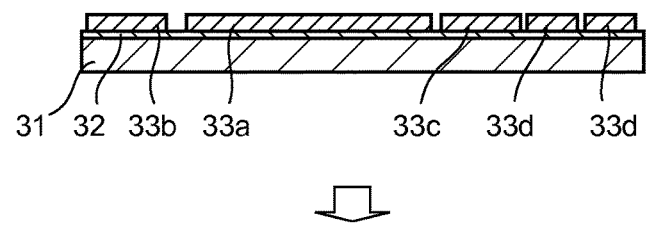
FIGS. 10A to 10E are views describing a method for manufacturing the semiconductor module.

In manufacturing the semiconductor module 30, first, as illustrated in FIG. 10A, the insulating layer 32 is formed on one main surface of the substrate 31 made of metal (insulating layer forming step). Then, the plural wiring patterns 33a to 33d are formed on the insulating layer 32 (wiring pattern forming step).

Figure 10B:
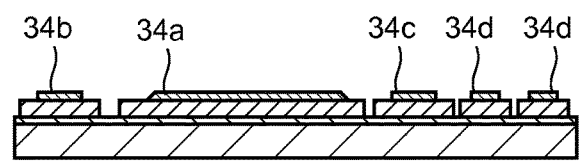

Thereafter, as illustrated in FIG. 10B, solder pastes (the solders 34a to 34d) are applied on the plural wiring patterns 33a to 33d, respectively (solder paste applying step).

Figure 10C:
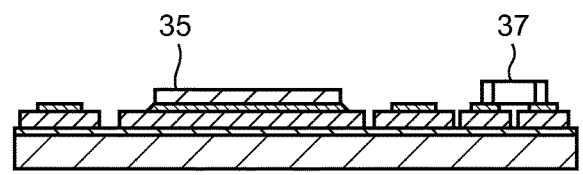

Then, as illustrated in FIG. 10C, one bare-chip FET 35 is mounted on the solder paste (the solder 33a) applied onto one wiring pattern 33a out of the plural wiring patterns 33a to 33d (bare-chip FET mounting step), and the other substrate-mounted component 37 is mounted on the solder paste (the solder 34d) applied onto another wiring pattern 33d. Another bare-chip FET 35 is also mounted on a wiring pattern identical to or different from the wiring pattern 33a.

Figure 10D:
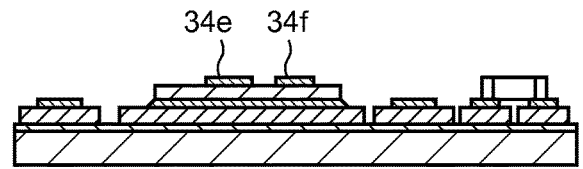

Subsequently, as illustrated in FIG. 10D, a solder paste (the solders 34e and 34f) is applied onto the source electrode S and the gate electrode G formed on the top surface of the bare-chip FET 35 (solder paste applying step).

Figure 10E:
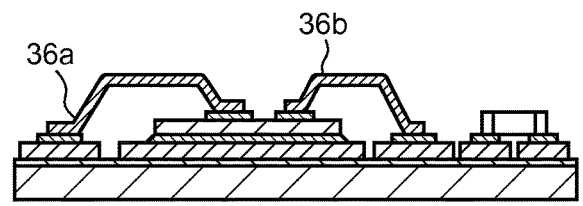

Thereafter, as illustrated in FIG. 10E, the source-electrode metal plate connector 36a is mounted on the solder paste (the solder 34e) applied onto the source electrode S of the bare-chip FET 35 and the solder paste (the solder 34b) applied onto the wiring pattern 33b other than the wiring pattern 33a, on which the bare-chip FET 35 is mounted, out of the plural wiring patterns 33a to 33d (source-electrode metal plate connector mounting step).

In addition, the gate-electrode metal plate connector 36b is mounted on the solder paste (the solder 34f) applied onto the gate electrode G of the bare-chip FET 35 and the solder paste (the solder 34c) applied onto still another wiring pattern 33c other than the wiring pattern 33a on which the bare-chip FET 35 is mounted and other than the wiring pattern 33b on which the source-electrode metal plate connector 36a is mounted, out of the plural wiring patterns 33a to 33d (gate-electrode metal plate connector mounting step). An intermediate semiconductor module assembly is constructed in this way.

The intermediate semiconductor module assembly constructed through the steps described above is put into a reflow furnace (not illustrated), and the jointing between one wiring pattern 33a out of the plural wiring patterns 33a to 33d and the bare-chip FET 35 via the solder 34a, the jointing between the wiring pattern 33d and the other substrate-mounted component 37 via the solder 34d, the jointing between the source electrode S formed on the top surface of the bare-chip FET 35 and the source-electrode metal plate connector 36a via the solder 34e, the jointing between another wiring pattern 33b out of the plural wiring patterns 33a to 33d and the source-electrode metal plate connector 36a via the solder 34b, the jointing between the gate electrode G formed on the top surface of the bare-chip FET 35 and the gate-electrode metal plate connector 36b via the solder 34f, and the jointing between still another wiring pattern 33c out of the plural wiring patterns 33a to 33d and the gate-electrode metal plate connector 36b via the solder 34c are collectively carried out (jointing step).

The semiconductor module 30 is completed in this way.

Here, the source electrode S of the bare-chip FET 35 and the wiring pattern 33b on the substrate 31 can be jointed using the source-electrode metal plate connector 36a by the solder mounting operation and the gate electrode G of the bare-chip FET 35 and another wiring pattern 33c on the substrate 31 can be jointed using the gate-electrode metal plate connector 36b by the solder mounting operation. That is, it is possible to carry out the jointing between the source electrode S of the bare-chip FET 35 and the wiring pattern 33b on the substrate 31 and the jointing between the gate electrode G of the bare-chip FET 35 and another wiring pattern 33c on the substrate 31, simultaneously by the same facility and further in the same process as the facility and the process in which the solder mounting operation for mounting the bare-chip FET 35 or the other substrate-mounted component 37 on the wiring patterns 33a and 33d on the substrate 31 is performed. As a result, it is possible to shorten the manufacturing tact time of the semiconductor module 30, to make a dedicated wire bonding facility unnecessary, and to reduce the manufacturing costs of the semiconductor module 30.

It is noted that the substrate 31 of the semiconductor module 30 made of aluminum, and the source-electrode metal plate connector 36a and the gate-electrode metal plate connector 36b made of material having both stiffness and high electric conductivity. The linear expansion coefficient of aluminum is $23.6 \times 10^{-6}/°$ C., and the linear expansion coefficient of the copper material is $16.8 \times 10^{-6}/°$ C. as an example. That is, the substrate 31 is more easily deformed by a temperature change than the source-electrode metal plate connector 36a and the gate-electrode metal plate connector 36b.

Therefore, if the temperature becomes high in a reflow process or due to heat generation during an electric power steering (EPS) operation, stress is applied to the metal plate connectors 36a and 36b due to a difference in the coefficients of expansion of the substrate 31 and the metal plate connectors 36a and 36b. At this time, when the metal plate connectors 36a and 36b have the structure that cannot reduce this stress, the soldering between the bare-chip FET 35 and the metal plate connectors may be released.

In contrast, in the present embodiment, the metal plate connectors 36a and 36b are made into a bridge shape such that respective sides of the bridge shaped not only expands and contracts, but also are deformable in a direction in which the respective bent portions are bending. Thus, the effect of a plate spring is obtained, and displacement in vertical and horizontal directions (a Z-axis direction and an X-axis direction of FIG. 7) is absorbable by virtue of a bridge shape framework. That is, in a case where deformation of the substrate 31 and the metal plate connectors 36a and 36b occurs due to thermal expansion or thermal contraction, the metal plate connectors 36a and 36b can be easily bent.

In this way, since the metal plate connectors 36a and 36b can appropriately absorb displacement when being deformed in the reflow process and when being deformed due to heat generation during the EPS operation, it is possible to prevent the soldering between the metal plate connectors 36a and 36b and the bare-chip FET 35 from separating, and to sure the reliability of electric connection.

Moreover, the center of gravity (C) can be provided at the flat surface (flat plate portion 36aa) of a substantially middle portion of the metal plate connector 36a or 36b by forming the metal plate connector 36a or 36b in the bridge shape. Therefore, when the metal plate connectors 36a and 36b are suctioned and held by air suction with a carrying tool in loading to the substrate 31, this flat surface can be used as a suction surface. Accordingly, the metal plate connectors 36a and 36b can be suctioned and held in a well-balanced manner, and components arrangement position accuracy can be improved.

To describe in more detail, when the metal plate connectors 36a and 36b are installed and soldered at shifted positions from regular installation positions, the area of the jointing between the electrodes and the wiring patterns becomes smaller than a regular jointing area. Thus, when a high current flows, the problems such as overheating or firing may occur. However, by suctioning and holding the centers of gravity (C) of the metal plate connectors 36a and 36b to transfer the metal plate connectors, the metal plate connectors 36a and 36b can be installed with excellent positioning accuracy, and the metal plate connectors 36a and 36b can be installed at regular installation positions without causing positional deviation (for example, positional deviation in a state where the metal plate connectors are moved in the X-axis direction, in the Y-axis direction, or in the Z-axis direction illustrated in FIG. 7 and positional deviation in a state where the metal plate connectors are rotated around a Z-axis). Hence, even when a high current flows, problems, such as overheating or firing, does not easily occur. Additionally, since it is possible to install the metal plate connectors 36a and 36b at the regular installation positions precisely, the metal plate connectors are suitable for high-density mounting.

Additionally, since the cut portions 36ak formed by the progressive press is arranged at the flat surface (flat plate portion 36aa) of the metal plate connector 36a or 36b, cutting is easily performed, and deformation of components in a cutting process can be suppressed. Moreover, since the cut portions 36ak formed by the progressive press having a shape protruding outward from the flat plate portion 36aa, cutting can be performed without deforming the flat surface of the flat plate portion 36aa.

Additionally, since the metal plate connector 36a or 36b includes the four bent portions and has a substantially hat-shaped cross-section that also has a bridge shape, the metal plate connector can be more suitably manufactured using press molding. That is, spring back caused by press working can be prevented, and part accuracy can be improved. Moreover, since the angle of the four bent portions is an obtuse angle, mold releasability during press molding can be improved, which contributes to reduction of the manufacturing costs. Additionally, if the angle of the four bent portions is an obtuse angle, stress acts on the metal plate connector 36a or 36b inward in the width direction of the flat plate portion 36aa or the flat plate portion 36ba, the metal plate connector 36a or 36b can be installed in a stable state.

As mentioned above, since the metal plate connectors 36a and 36b have the bridge shape, displacement absorbency can be improved. Additionally, since the metal plate connectors 36a and 36b have the bridge shape, an air suction surface by a jig in assembling is a flat surface and becomes the center of gravity, whereby the stability in loading of components to the substrate can be secured. Therefore, positional deviation can be prevented, and the reliability of electrical contact can be secured.

Additionally, the metal plate connectors are formed of materials having stiffness and high electric conductivity, such as copper (Cu), silver (Ag), gold (Au), a copper alloy, and an aluminum alloy conductor, so as to have elasticity at least in a direction horizontal to the substrate.

Although the embodiment of the invention has been described above, the invention is not limited to this, and various alternations and improvements can be made.

For example, although the bare-chip FETs 35 are used as the semiconductor module 30, not only the bare-chip FETs 35 but also other bare-chip transistors, such as bare-chip IGBTs, may be used. When the other bare-chip transistors are used, the top of an electrode formed on an upper surface of a bare-chip transistor and the top of another wiring pattern other than a wiring pattern, to which the bare-chip transistor is jointed, among the plural wiring patterns may be jointed together via solder by a metal plate connector. Accordingly, the jointing between the electrode of the bare-chip transistor and the wiring pattern on the substrate can be simultaneously performed by the same facility and in the same process as the facility and the process in which the solder mounting operation for mounting the bare-chip transistor and other substrate-mounted components on the wiring patterns on the substrate is performed.

Furthermore, when the bare-chip IGBT is used as a bare-chip transistor, it is preferable to joint an emitter electrode and a gate electrode formed on a bare-chip IGBT to wiring patterns on a substrate, respectively, via solder using metal plate connectors.

In this way, when the bare-chip IGBT is used and the emitter electrode and the gate electrode formed on the bare-chip IGBT are jointed to the wiring patterns on the substrate, respectively, via solder using the metal plate connectors, the jointing between the emitter electrode of the bare-chip IGBT and a wiring pattern on the substrate and the jointing between the gate electrode of the bare-chip IGBT and the other wiring pattern on the substrate can be simultaneously performed in the same facility and the same process as the facility and the process in which the solder mounting operation for mounting the bare-chip transistor and the other substrate-mounted components on the wiring patterns on the substrate is performed.

Furthermore, in the semiconductor module 30, there is one type of gate-electrode metal plate connector and there are two types of source-electrode metal plate connectors including a first source-electrode metal plate connector (see Tr2 and Tr4 in FIG. 4) arranged 180 degrees straightly with respect to the gate-electrode metal plate connector and a second source-electrode metal plate connector (see Tr1, Tr3, and Tr5 in FIG. 4) arranged 90 degrees perpendicularly with respect to the gate-electrode metal plate connector. The one type of gate-electrode metal plate connector and any source-electrode metal plate connector selected from two types of the first source-electrode metal plate connector and the second source-electrode metal plate connector can be used in combination for one bare-chip FET.

The arrangement (the angle formed by the gate-electrode metal plate connector and the first source-electrode metal plate connector) of the first source-electrode metal plate connector with respect to the gate-electrode metal plate connector preferably ranges from 95 degrees to 265 degrees, more preferably ranges from 160 degrees to 200 degrees, still more preferably ranges from 175 degrees to 185 degrees, and is most preferably set to 180 degrees.

The arrangement (the angle formed by the gate-electrode metal plate connector and the second source-electrode metal plate connector) of the second source-electrode metal plate connector with respect to the gate-electrode metal plate connector preferably ranges from 5 degrees to 175 degrees, more preferably ranges from 70 degrees to 120 degrees, still more preferably ranges from 85 degrees to 95 degrees, and is most preferably set to 90 degrees.

Similarly to the above-mentioned semiconductor module 30, according to this semiconductor module, a degree of freedom in arranging the bare-chip transistor mounted on the substrate increases, a degree of freedom in design of wirings on the substrate increases, and thus the layout of the semiconductor module on the substrate can be made to be compact. It is possible to easily make the path lengths for phases of a three-phase motor on the substrate identical. Accordingly, it is possible to make characteristics of the phases of the three-phase motor, particularly, the impedance characteristics of the phases, easily match each other, thereby improving ripple accuracy of torque, velocity, and so on.

REFERENCE SIGNS LIST

1: steering wheel
2: column shaft
3: reduction gear
4A, 4B: universal joint
5: rack and pinion mechanism
6: tie rod
7: torque sensor
8: electric motor
9: vehicle velocity sensor
10: controller
11: control calculating device
12: gate drive circuit
13: motor drive unit
14: breaker device for emergency stop
15: current detecting circuit
16: rotation sensor
17: rotor position detecting circuit
18: IGN voltage monitoring unit
19: power supply circuit unit
20: case
21: semiconductor module placement section
21a: screw hole
22: power/signal connector mounting section
23: three-phase output connector mounting section
23a: screw hole
24: attachment post
24a: screw hole
30: semiconductor module
31: substrate
31a: through-hole
32: insulating layer
33a to 33d: wiring pattern
34a to 34d: solder
35: bare-chip FET (bare-chip transistor)
36a: source-electrode metal plate connector
36aa: flat plate portion
36ab: connecting portion (first leg)
36ac: connecting portion (second leg)
36ad: first bent portion
36ae: second bent portion
36af: joint surface
36ag: narrow portion
36ah: third bent portion
36af: fourth bent portion
36af: joint surface
36ak: cut portion formed by the progressive press
36b: gate-electrode metal plate connector
36ba: flat plate portion
36bb: connecting portion
36bc: connecting portion
37: substrate-mounted component
38: attachment screw
39: heat-dissipating sheet
40: control circuit board
40a: through-hole
41: attachment screw
50: power/signal connector
51: attachment screw
60: three-phase output connector
60a: through-hole
61: attachment screw
70: cover
81: power supply line
81a: positive electrode terminal
82: ground line
82a: negative electrode terminal
90: three-phase output portion
91a: a-phase output line
91b: b-phase output line
91c: c-phase output line
G: gate electrode (electrode)
S: source electrode (electrode)
C: center of gravity

The invention claimed is:

1. A semiconductor module comprising:
a substrate made of metal;
an insulating layer formed on the substrate;
a plurality of wiring patterns formed on the insulating layer;
a bare-chip transistor mounted on one wiring pattern out of the plurality of wiring patterns via a solder; and
a metal plate connector formed of a metal plate, the metal plate connector jointing an electrode formed on a top surface of the bare-chip transistor and another wiring pattern out of the plurality of wiring patterns via a solder, wherein the metal plate connector has a bridge shape including a horizontal flat plate portion; a first leg being bent so as to fall down from one end of the flat plate portion in a width direction of the flat plate portion and jointed on the electrode; and a second leg being bent so as to fall down from the other end of the flat plate portion in the width direction and jointed on the another wiring pattern, the metal plate connector is made of any one material out of copper (Cu), silver (Ag), gold (Au), a copper alloy, and an aluminum alloy conductor so as to have elasticity at least in a horizontal direction, the flat plate portion connecting the first leg and the second leg of the metal plate connector has a flat surface on which a center of gravity is located, and a thickness of the flat plate portion is larger than a thickness of a portion of the metal plate connector other than the flat plate portion, the bare-chip transistor is a bare-chip FET having a source electrode and a gate electrode formed on a top surface thereof, the metal plate connector includes a source electrode metal plate connector and a gate electrode metal plate connector, the source electrode of the bare-chip FET and the another wiring pattern out of the plurality of wiring patterns are jointed by the source electrode metal plate connector via a solder, the gate electrode of the bare-chip FET and a further another wiring pattern out of the plurality of wiring patterns is jointed by the gate electrode metal plate connector via a solder, the gate electrode metal plate falls into one type, and the source electrode metal plate connector falls into two types including a first source electrode metal plate connector arranged 180 degrees straightly with respect to the gate electrode metal plate connector, and a second source electrode metal plate connector arranged 90 degrees perpendicularly with respect to the gate electrode metal plate connector, and the one type of gate electrode metal plate connector and a source electrode metal plate connector selected from either of the two types including the first source electrode metal plate connector or the second source electrode metal plate connector are used in combination with each other on one bare-chip FET.

2. The semiconductor module according to claim 1,
wherein an end of the first leg is connected to the one end of the flat plate portion in the width direction via a first bent portion, and a joint surface jointed via the solder on the electrode is connected to another end of the first leg via a second bent portion so as to protrude outward in the width direction of the flat plate portion, and an end of the second leg is connected to the other end of the flat plate portion in the width direction via a third bent portion, and a joint surface jointed via the solder on the another wiring pattern is connected to another end of the second leg via a fourth bent portion so as to protrude outward in the width direction of the flat plate portion.

3. The semiconductor module according to claim 2, wherein each of angles of the first bent portion, the second bent portion, the third bent portion, and the fourth bent portion is an obtuse angle.

4. The semiconductor module according to claim 1,
wherein an end of the first leg is connected to the one end of the flat plate portion in the width direction via a first bent portion, and a joint surface jointed via the solder on the electrode is connected to another end of the first leg via a second bent portion so as to protrude outward in the width direction of the flat plate portion, and an end of the second leg is connected to the other end of the flat plate portion in the width direction via a third bent portion, and a joint surface jointed via the solder on the another wiring pattern is connected to another end of the second leg via a fourth bent portion so as to protrude outward in the width direction of the flat plate portion.

5. The semiconductor module according to claim 4, wherein each of angles of the first bent portion, the second bent portion, the third bent portion, and the fourth bent portion is an obtuse angle.

6. The semiconductor module according to claim 1, wherein
the semiconductor module is used in a motor drive unit for driving a three-phase brushless motor of an electric power steering apparatus, and
path lengths for all phases of the three-phase brushless motor are identical.

* * * * *